(12) United States Patent
Tetelbaum

(10) Patent No.: US 7,062,731 B2
(45) Date of Patent: Jun. 13, 2006

(54) METHOD OF NOISE ANALYSIS AND CORRECTION OF NOISE VIOLATIONS FOR AN INTEGRATED CIRCUIT DESIGN

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 378 days.

(21) Appl. No.: 10/665,927

(22) Filed: Sep. 17, 2003

(65) Prior Publication Data

US 2005/0060675 A1    Mar. 17, 2005

(51) Int. Cl.
*G06F 17/50* (2006.01)

(52) U.S. Cl. .................. 716/4; 716/5; 716/6; 716/10
(58) Field of Classification Search ............ 716/1–18; 703/13–19
See application file for complete search history.

(56) References Cited

U.S. PATENT DOCUMENTS

| | | | |
|---|---|---|---|
| 5,535,133 A * | 7/1996 | Petschauer et al. ........... 716/19 |
| 5,555,506 A * | 9/1996 | Petschauer et al. ........... 703/13 |
| 5,568,395 A * | 10/1996 | Huang ............................. 716/4 |
| 5,596,506 A * | 1/1997 | Petschauer et al. ............. 716/5 |
| 6,327,542 B1 * | 12/2001 | McBride ....................... 702/64 |
| 6,363,516 B1 * | 3/2002 | Cano et al. ..................... 716/5 |
| 6,378,109 B1 * | 4/2002 | Young et al. ................... 716/4 |
| 6,493,853 B1 * | 12/2002 | Savithri et al. ................ 716/5 |
| 6,499,131 B1 * | 12/2002 | Savithri et al. ................ 716/5 |
| 6,523,149 B1 * | 2/2003 | Mehrotra et al. .............. 716/4 |
| 6,601,222 B1 * | 7/2003 | Mehrotra et al. .............. 716/5 |
| 6,615,395 B1 * | 9/2003 | Hathaway et al. ............. 716/6 |
| 6,732,339 B1 * | 5/2004 | Savithri et al. ................ 716/4 |
| 6,853,967 B1 * | 2/2005 | Roberts ........................ 703/14 |
| 6,990,420 B1 * | 1/2006 | Guo et al. .................... 702/79 |

\* cited by examiner

*Primary Examiner*—Paul Dinh
*Assistant Examiner*—Nghia M. Doan
(74) *Attorney, Agent, or Firm*—Fitch, Even, Tabin & Flannery

(57) ABSTRACT

A method of noise analysis and correction of noise violations for an integrated circuit design includes steps of receiving as input a standard parasitic exchange file for an integrated circuit design and parsing the standard parasitic exchange file to generate a resistance graph. A representation of the resistance graph is generated to determine noise critical nets. A list is generated of only noise critical nets from the representation of the resistance graph. A net is selected from the list of only noise critical nets, and a value of total crosstalk noise in the selected net from all aggressor nets relative to the selected net is calculated. The value of total crosstalk noise in the selected net is generated as output for correcting a noise violation.

27 Claims, 10 Drawing Sheets

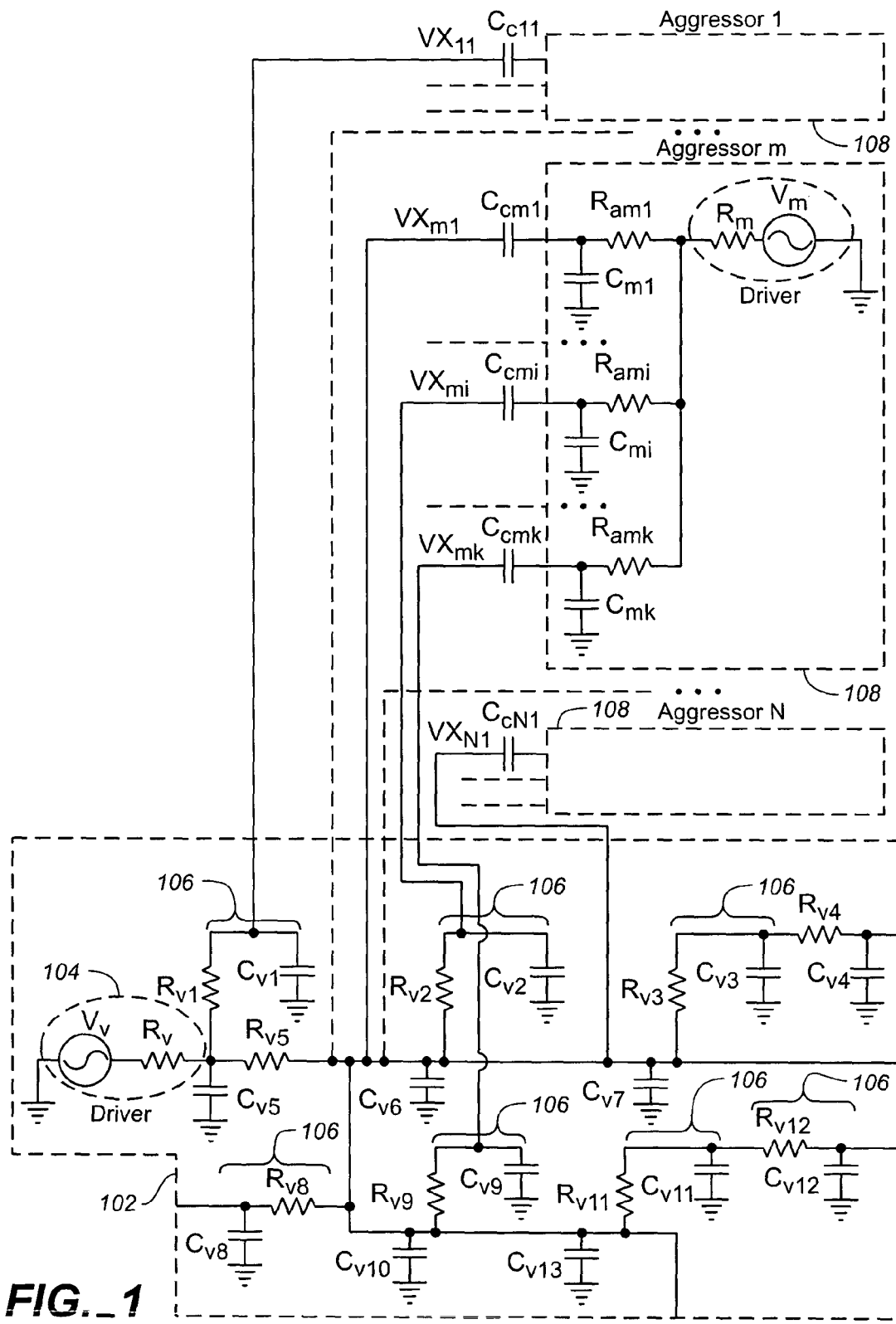
FIG._1

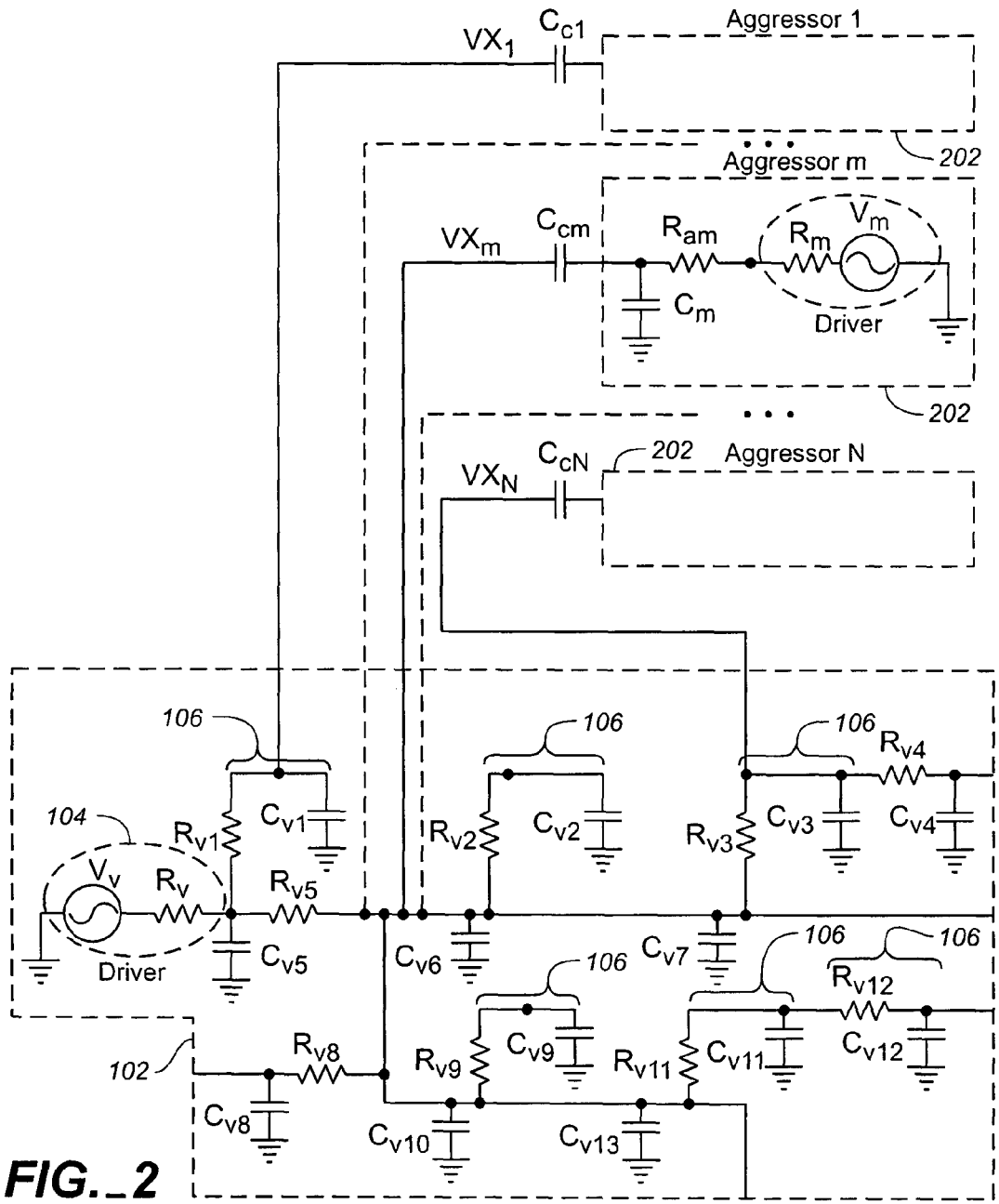
FIG._2

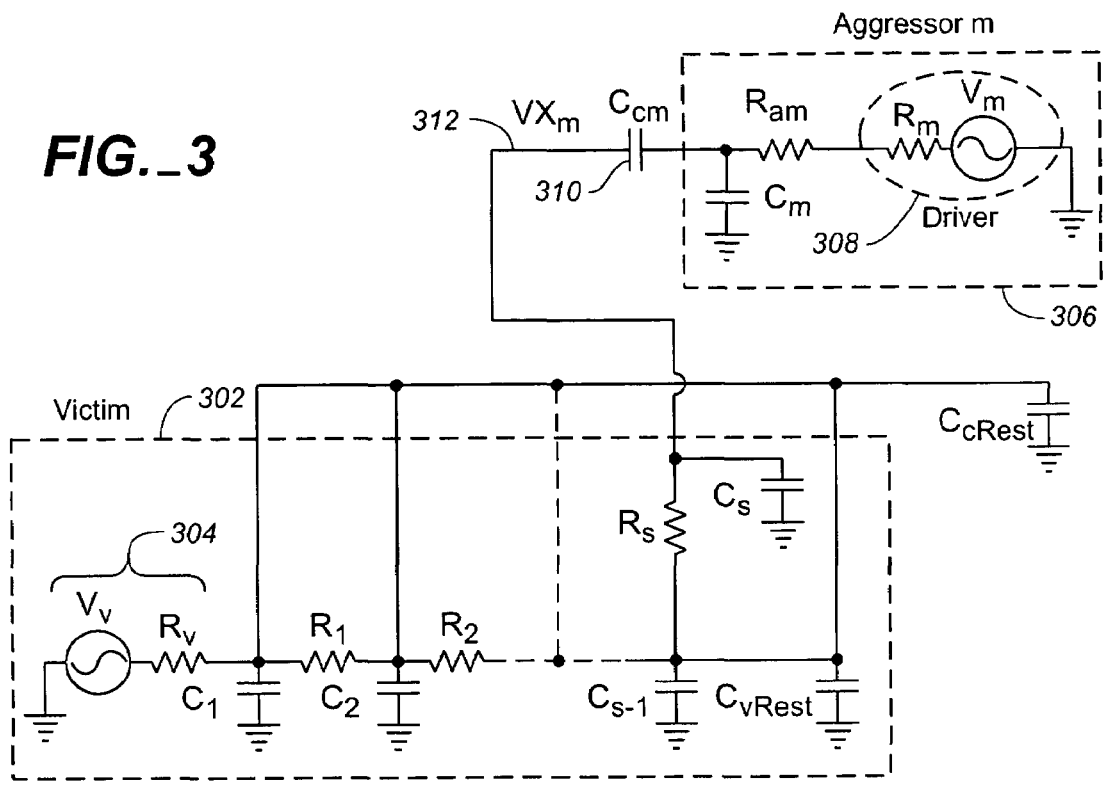
FIG._3
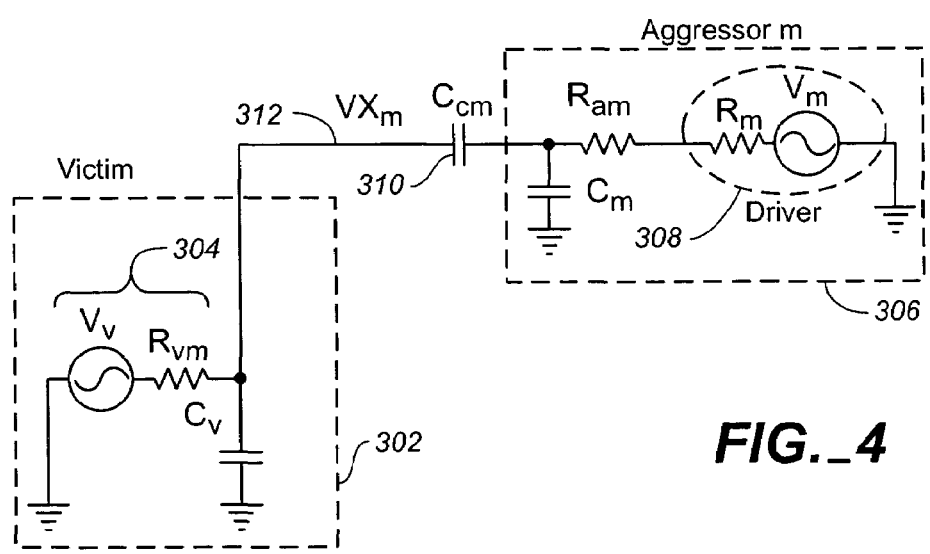
FIG._4

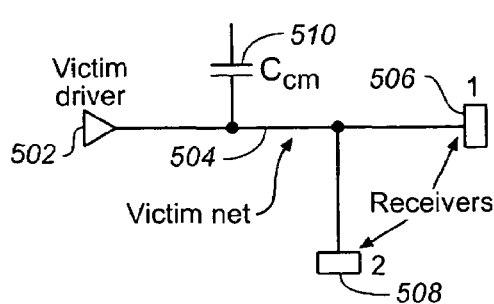
FIG._5A
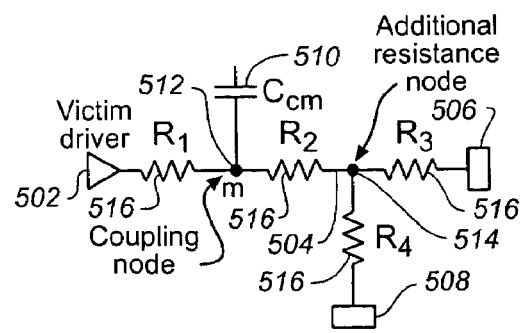
FIG._5B
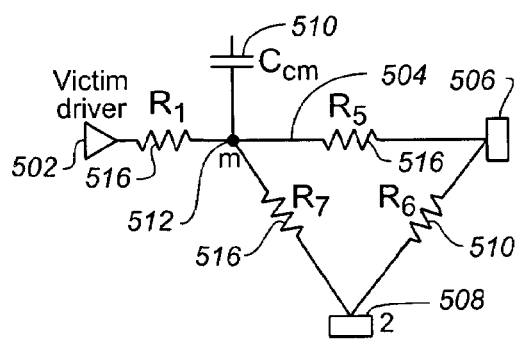
FIG._5C
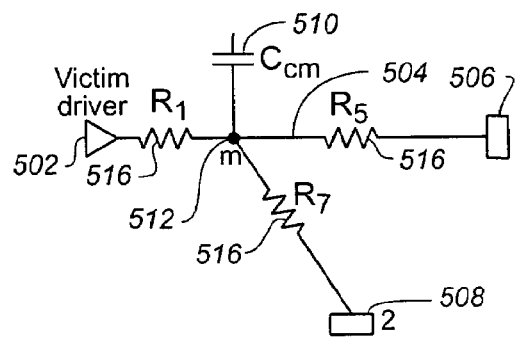
FIG._5D
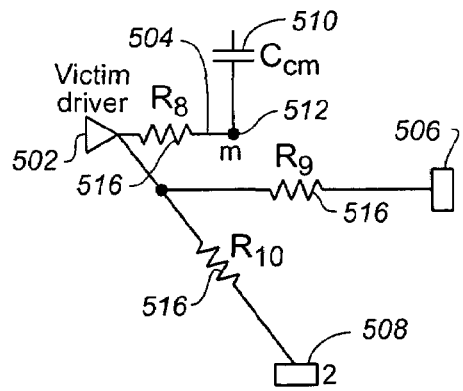
FIG._5E

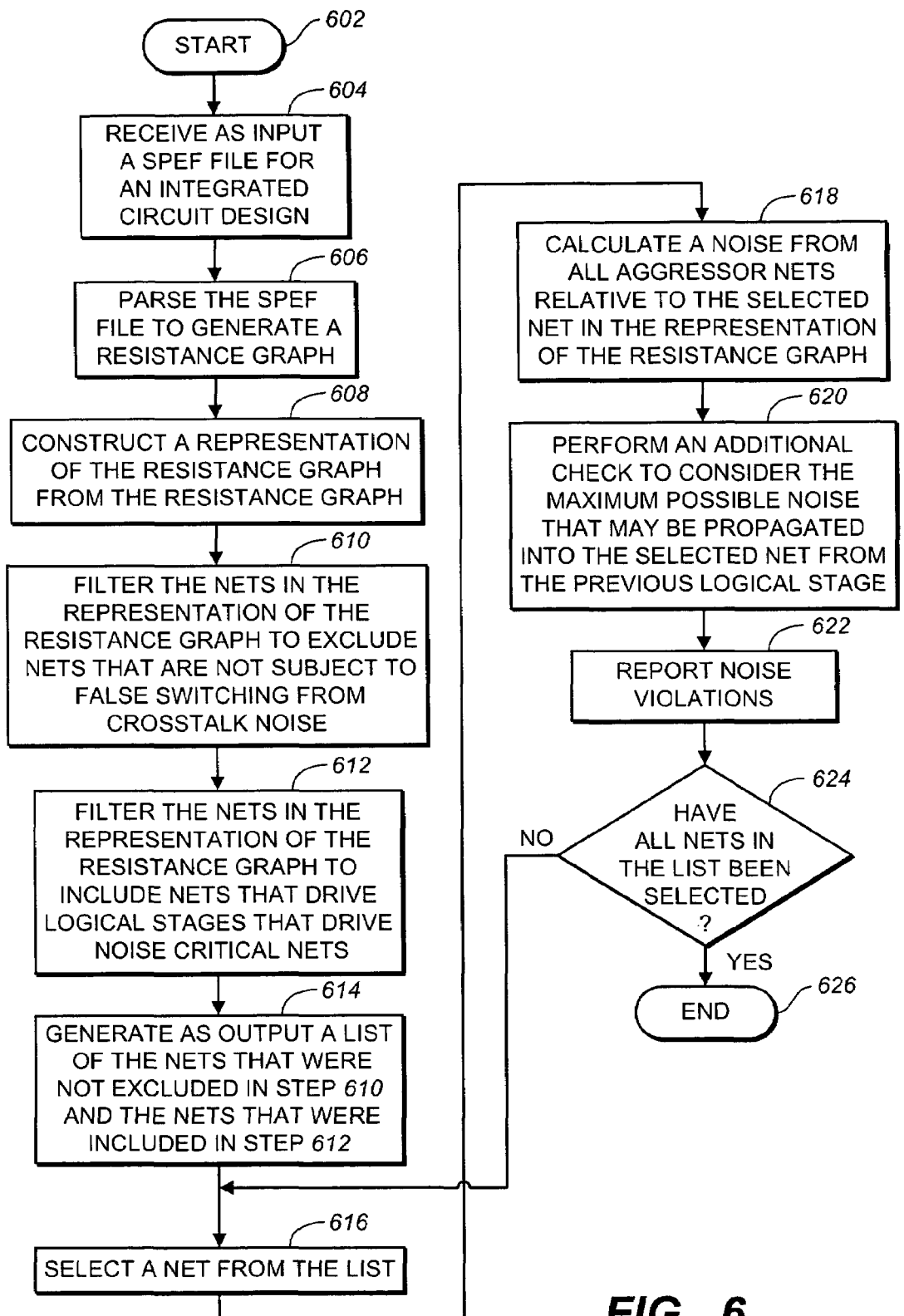
FIG._6

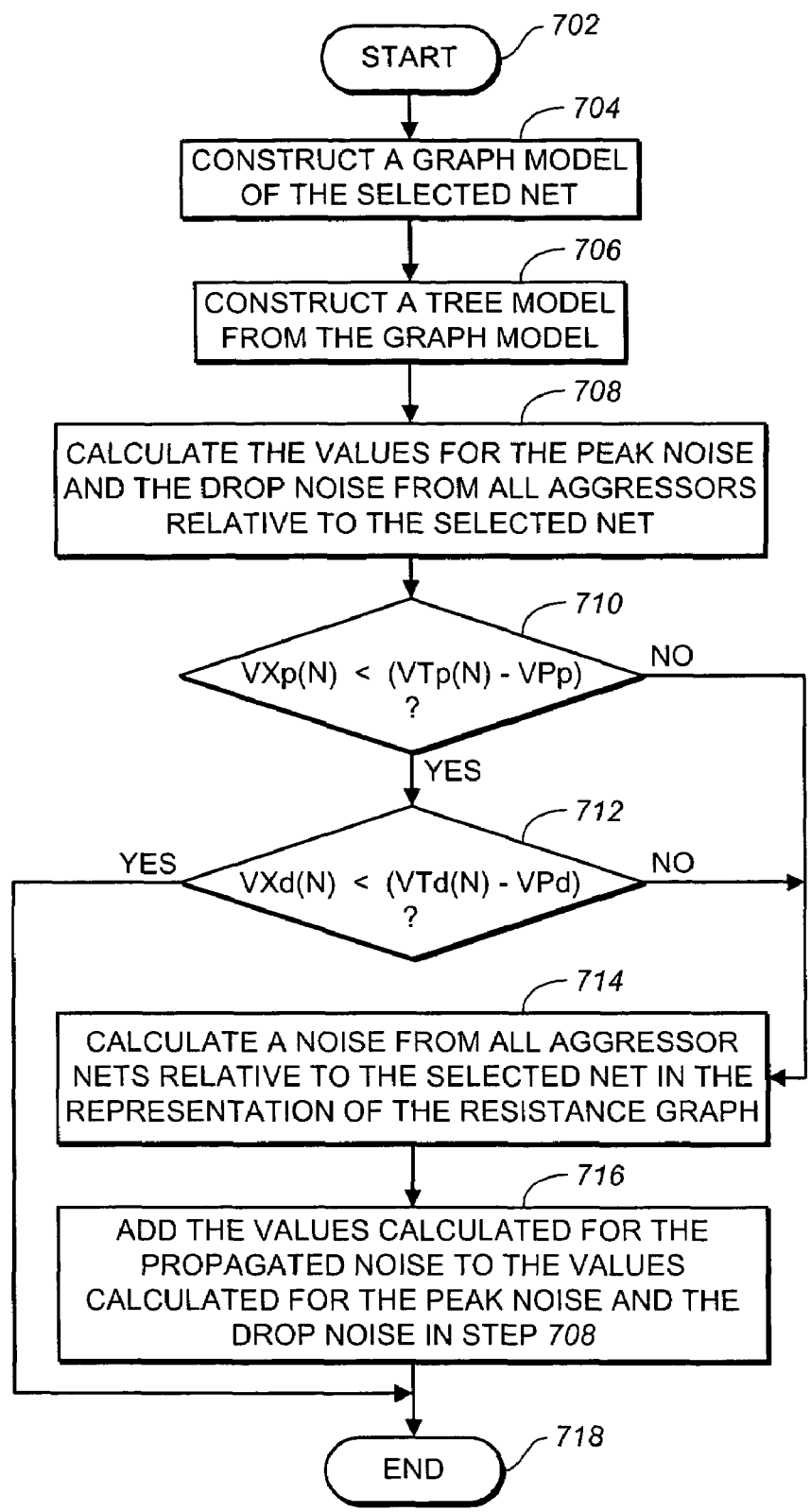
FIG._7

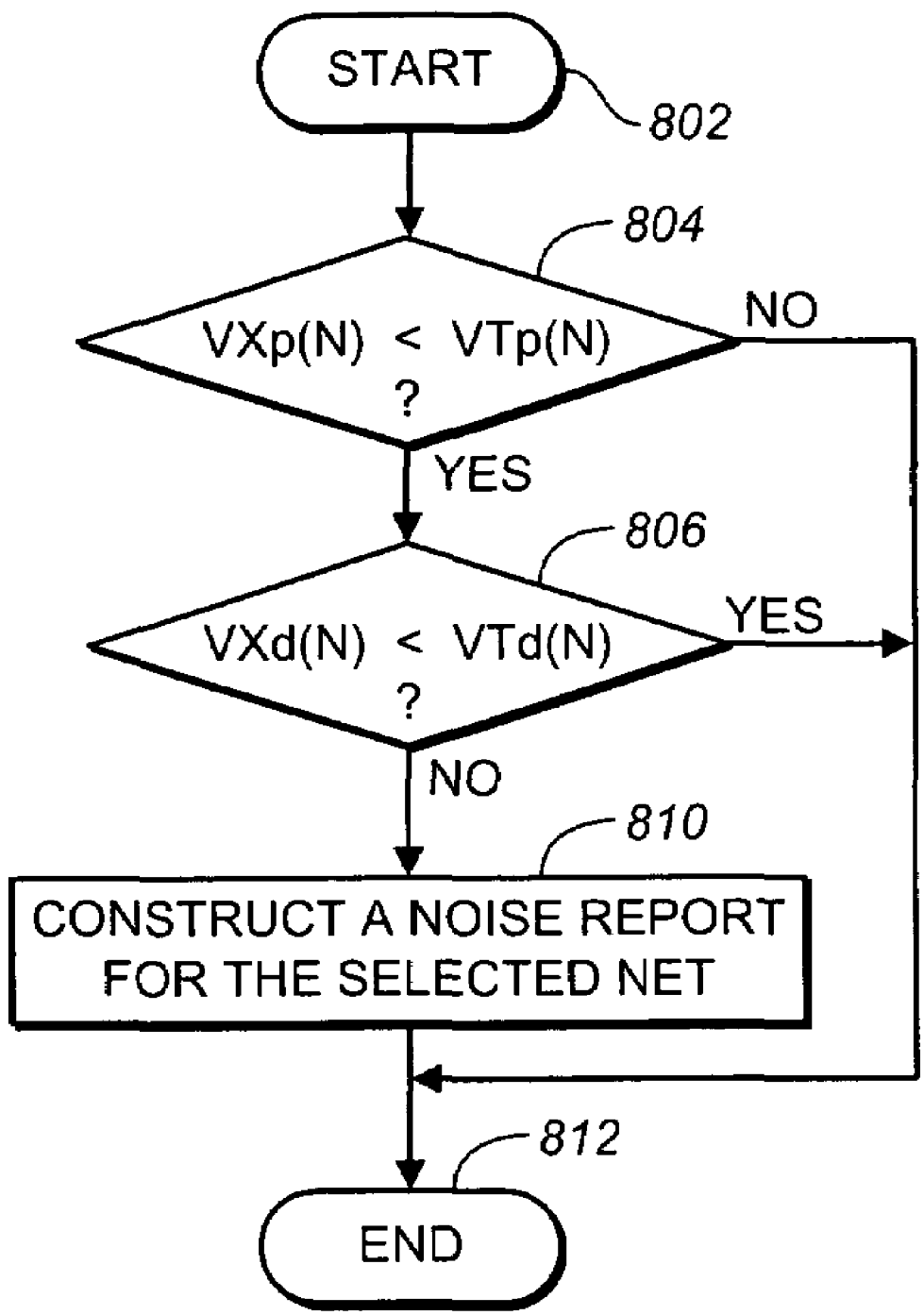
FIG._8

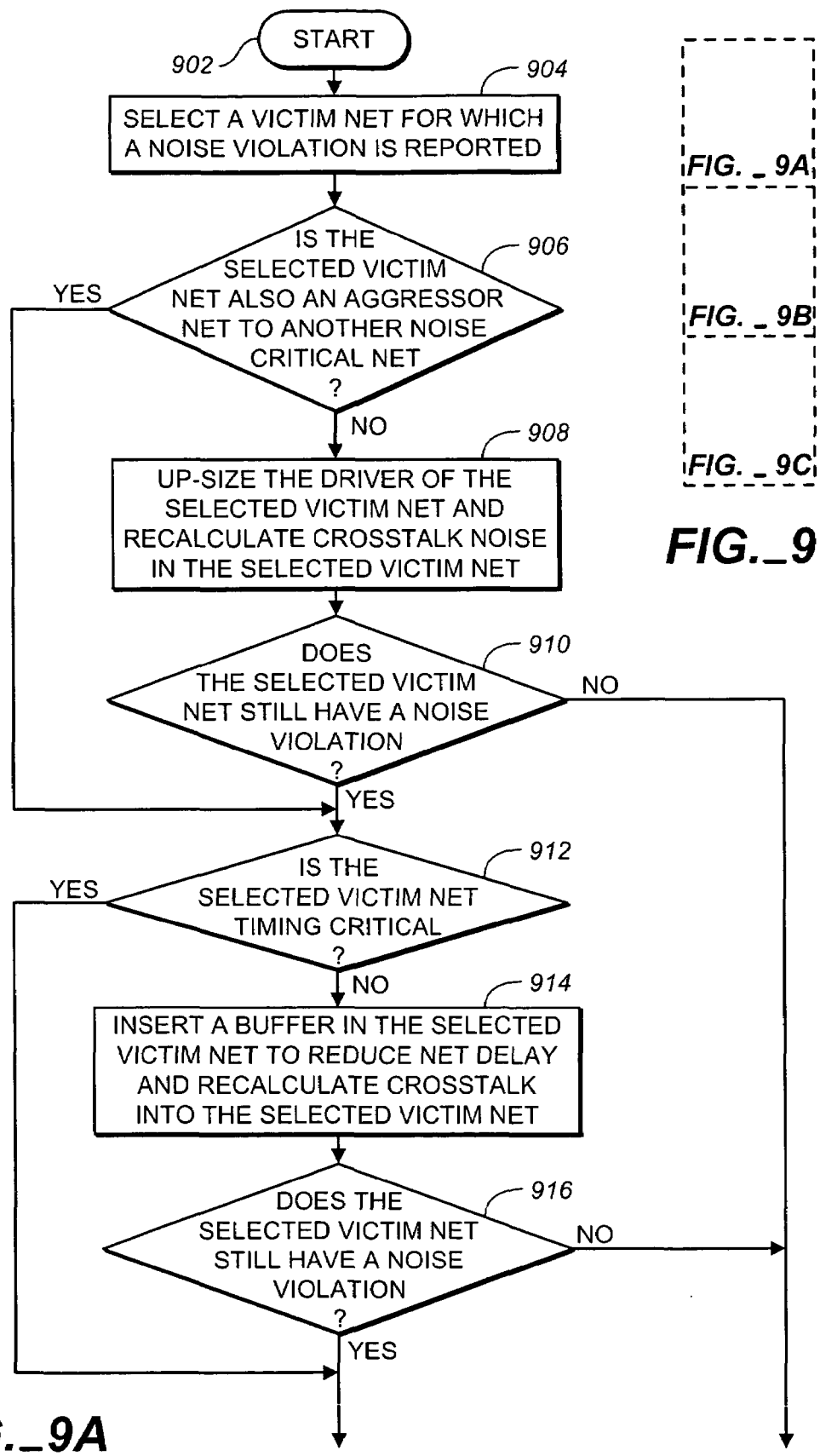
FIG._9A

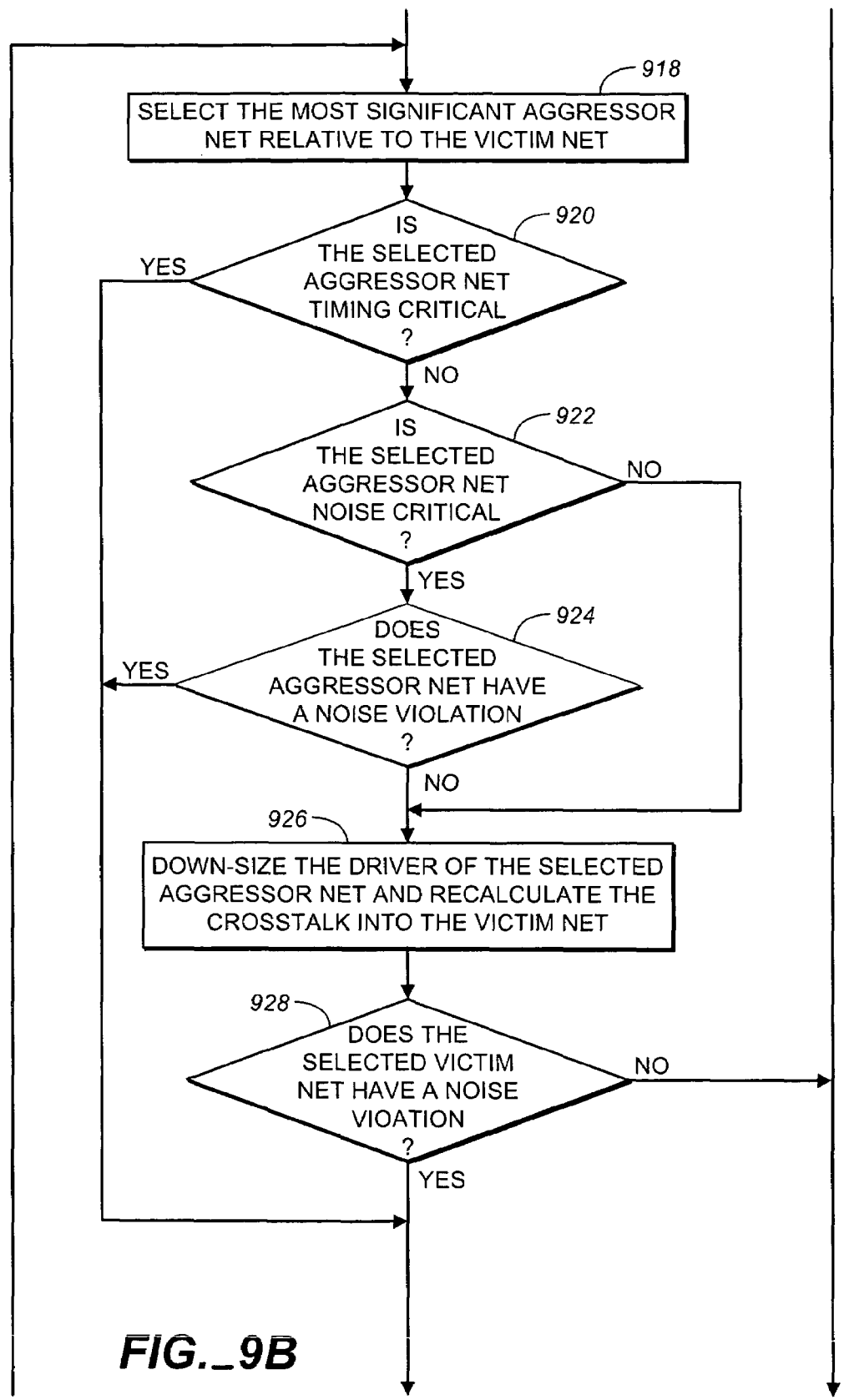
FIG._9B

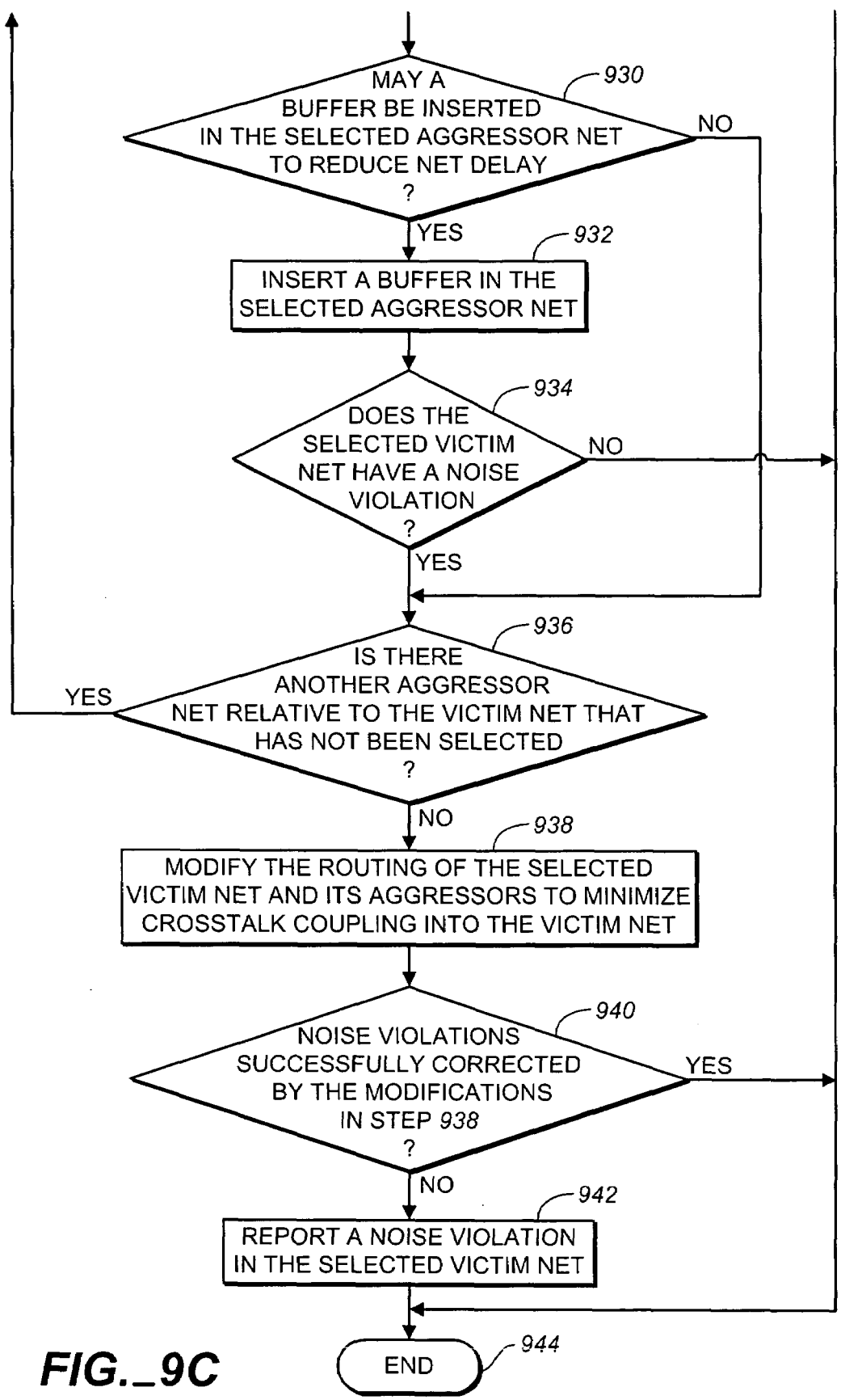
FIG._9C

METHOD OF NOISE ANALYSIS AND CORRECTION OF NOISE VIOLATIONS FOR AN INTEGRATED CIRCUIT DESIGN

BACKGROUND OF THE INVENTION

1. Field of the Invention

The present invention relates generally to the design of integrated circuits. More specifically, but without limitation thereto, the present invention relates to methods of estimating and avoiding crosstalk in an integrated circuit design.

2. Description of Related Art

With the dramatic increase in very large scale integrated circuit (VLSI) chip gate counts and circuit density, circuit noise resulting from crosstalk interference is becoming increasingly significant. Noise analysis is an important step in the design flow of integrated circuits, because crosstalk interference may result in false switching and failure of the design to meet performance specifications. Computer software tools have been developed for analyzing crosstalk noise, however, these tools may not be suitable for a variety of applications. Such tools generally require preparation of several special input files that require other software tools, which increases the turnaround time (TAT). The accuracy of the noise calculations is also limited by the accuracy of the software tools used to prepare the special input files.

SUMMARY OF THE INVENTION

In one aspect of the present invention, a method of noise analysis and correction of noise violations for an integrated circuit design includes steps of:
(a) receiving as input a standard parasitic exchange file for an integrated circuit design;
(b) parsing the standard parasitic exchange file to generate a resistance graph;
(c) generating a representation of the resistance graph to determine noise critical nets;
(d) generating a list of only noise critical nets from the representation of the resistance graph;
(e) selecting a net from the list of only noise critical nets;
(f) calculating a value of total crosstalk noise in the selected net from all aggressor nets relative to the selected net; and
(g) generating as output the value of total crosstalk noise in the selected net for correcting a noise violation.

In another aspect of the present invention, a computer program product for analyzing noise and correcting noise violations for an integrated circuit design includes:
a medium for embodying a computer program for input to a computer; and
a computer program embodied in the medium for causing the computer to perform steps of:
(a) receiving as input a standard parasitic exchange file for an integrated circuit design;
(b) parsing the standard parasitic exchange file to generate a resistance graph;
(c) generating a representation of the resistance graph to determine noise critical nets;
(d) generating a list of only noise critical nets from the representation of the resistance graph;
(e) selecting a net from the list of only noise critical nets;
(f) calculating a value of total crosstalk noise in the selected net from all aggressor nets relative to the selected net; and
(g) generating as output the value of total crosstalk noise in the selected net for correcting a noise violation.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a circuit model for a noise calculation according to an embodiment of the present invention;

FIG. 2 illustrates a simplified circuit model of FIG. 1 in which a separate aggressor is associated with each crosstalk coupling point;

FIG. 3 illustrates a chain structure for calculating noise from each aggressor net in the simplified circuit model of FIG. 2;

FIG. 4 illustrates the circuit model of FIG. 3 further simplified to illustrate a noise calculation according to an embodiment of the present invention;

FIGS. 5A, 5B, and 5C illustrate examples of net resistance graphs according to an embodiment of the present invention;

FIG. 5D illustrates an example of a resistance tree constructed from the resistance net graph of FIG. 5C;

FIG. 5E illustrates an example of a resistance star tree constructed from SPEF coordinates according to an embodiment of the present invention;

FIG. 6 illustrates a flow chart of a method of analyzing crosstalk noise according to an embodiment of the present invention;

FIG. 7 illustrates a flow chart for calculating noise in the selected net in the method of FIG. 6; and FIG. 8 illustrates a flow chart for performing an additional check to consider noise propagated into the selected net from the previous logical stage in the method of FIG. 6; and FIGS. 9A, 9B and 9C illustrate a flow chart for correcting a noise violation according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Crosstalk noise is generally capacitively coupled between traces in an integrated circuit and is most significant when the sources of the crosstalk, commonly referred to as aggressor nets or aggressors, have a fast switching waveform. The switching waveforms of one or more aggressor nets are coupled by parasitic capacitances to a "victim" net, that is, a net that is in a non-switching state when the crosstalk is generated. The crosstalk noise may cause false switching in the victim net and consequent failure of the integrated circuit design to meet performance specifications. To avoid the possibility of false switching, it is advantageous to estimate the crosstalk noise to determine whether a modification to the floorplan is needed to reduce the crosstalk noise below the input threshold of the victim net.

While commercial software tools have been developed for estimating crosstalk noise, these tools generally may not be tuned or refined to suit specific applications. The inflexibility of such noise analysis tools may include assumptions and limitations that are disadvantageous to resolving noise problems. For example, noise thresholds are assumed to be identical for all cells, which may not reflect the actual noise thresholds in the integrated circuit design. Noise violations are typically reported in all nets, even nets that do not drive state cells (flip-flops or other storage cells). Noise does not propagate from one stage to the next in a logical path, and the noise model may be inaccurate, resulting in false reporting. Additional input files may have to be generated, increasing turnaround time and incurring license fees. Also, the accuracy of the noise calculation depends on the accuracy of the additional input files, such as the ramptime data after a delay estimation. Disadvantageously, previous tools for noise analysis do not have the capability of generating the appropriate modifications to the floor plan needed to correct the noise violations that are reported.

To simplify the design flow, to decrease turnaround time, and to maintain control over the noise analysis procedure, the disadvantages of the previous noise analysis tools described above may be avoided by calculating the crosstalk noise from coupling information in the SPEF (Standard Parasitic Exchange Format, IEEE 1481-1999 clause 9) file that is included in the floorplan of an integrated circuit design. The method of crosstalk noise analysis and correction of noise violations of the present invention may be incorporated into a delay estimator that reads the SPEF file with coupling capacitance and wire resistance information. In an alternative embodiment, the method of crosstalk noise analysis and correction of noise violations of the present invention may be implemented as a separate tool for use with an SPEF file.

In one aspect of the present invention, a method of noise analysis for an integrated circuit design includes steps of:

(a) receiving as input a standard parasitic exchange file for an integrated circuit design;

(b) parsing the standard parasitic exchange file to generate a resistance graph;

(c) generating a representation of the resistance graph to determine noise critical nets;

(d) generating a list of only noise critical nets from the representation of the resistance graph;

(e) selecting a net from the list of only noise critical nets;

(f) calculating a value of total crosstalk noise in the selected net from all aggressor nets relative to the selected net; and (g) generating as output the value of total crosstalk noise in the selected net for correcting a possible noise violation.

FIG. 1 illustrates a circuit model for a noise calculation according to an embodiment of the present invention. Shown in FIG. 1 are a victim net 102, a victim driver cell 104, receiver cells 106, and aggressors 108.

The victim driver cell 104 and the receiver cells 106 constitute the victim net 102 that is representative of a fragment of a typical tree structure used, for example, in distributing a clock signal in an integrated circuit design. Each aggressor 108 generates a crosstalk noise VX coupled by a coupling capacitance $C_c$ to the receiver cells 106. As shown in FIG. 1, one aggressor 108 may couple crosstalk into the victim net 102 at multiple receiver cells 106. To simplify the representation, each point into which crosstalk is coupled into the victim net 102 may be associated with a separate aggressor.

FIG. 2 illustrates a simplified circuit model of FIG. 1 in which a separate aggressor is associated with each crosstalk coupling point. Shown in FIG. 2 are a victim net 102, a victim driver cell 104, receiver cells 106, and N aggressors 202.

The crosstalk noise coupled into the victim net 102 may be estimated according to the formula:

$$VX = \sum_{m=1}^{N} VX_m \quad (1)$$

To find the crosstalk noise $VX_m$ generated by the aggressor m, the circuit of FIG. 2 may be transformed with acceptable accuracy to the chain structure of FIG. 3.

FIG. 3 illustrates a chain structure for calculating noise from each aggressor net in the simplified circuit model of FIG. 2. Shown in FIG. 3 are a victim net 302, a victim driver 304, an aggressor m net 306, an aggressor driver 308, a coupling capacitance 310, and a crosstalk noise $VX_m$ 312.

In FIG. 3, the equivalent resistance of each of the receiver cells along the path from the victim driver 304 to the N coupling points in FIG. 2 from the aggressor m net 306 may be mapped as follows:

$$R_1 = R_{v5} \quad (2)$$

$$R_2 = R_s = R_{v2}$$

$$C_1 = C_{v5}$$

$$C_2 = C_{v6}$$

$$C_3 = C_s = C_{v2}$$

$$C_{cRest} = C_{c1} + C_{c2} + \ldots + C_{cm-1} + C_{cm+1} + \ldots + C_{cN}$$

$$C_{vRest} = (C_{v1} + C_{v2} + \ldots + C_{vn}) - (C_1 + C_2 + \ldots + C_N)$$

FIG. 4 illustrates the circuit model of FIG. 3 further simplified to illustrate a noise calculation according to an embodiment of the present invention. Shown in FIG. 4 are a victim net 302, a victim driver 304, an aggressor m net 306, an aggressor driver 308, a coupling capacitance 310, and a crosstalk noise $VX_m$ 312.

The values for $C_v$ and $R_{vm}$ may be calculated as follows:

$$C_v = C_1 + C_2 + \ldots + C_s + C_{vRest} + C_{cRest} \quad (3)$$

$$= C_{v1} + C_{v2} + \ldots + C_{vn} + C_{cRest}$$

$$R_{vm} = R_v + R_1 + R_2 + \ldots + R_s = R_v + R_{v\_m}$$

The crosstalk noise $VX_m$ 312 coupled into the victim net 302 by the aggressor m net 306 may be derived analytically from the model of FIG. 4 by the following formulas:

$$VX_m = V_{dd} \frac{\tau_{cm}}{\tau_T} \cdot \left(\frac{\tau_T}{\tau_m}\right)^{\frac{\tau_m}{\tau_m - \tau_T}} \quad \text{if } \tau_m - \tau_T \neq 0 \quad (4)$$

$$VX_m = V_{dd} \frac{\tau_{cm}}{\tau_T} \cdot e^{-1} \quad \text{if } \tau_m - \tau_T = 0$$

where:

$$\tau_m = (R_m + R_{am}) C_m$$

$$\tau_{cm} = R_{vm} C_{cm}$$

$$\tau_T = R_{vm} C_{vT}$$

Vdd is the voltage of power supply in the design. e is natural log base; it comes from the solution of differential equations describing signal transition for this timing condition ($\tau_m - \tau_T = 0$). In general, a timing transition is described as an exponential function of time V=EXP(−at).

The resistance $R_m$ is the equivalent transient resistance of the aggressor m net 306 that may be read from a cell library as the driver resistance of the aggressor driver 308 for selected operating conditions WC (worst case), BC (best case), and NC (nominal case).

The resistance $R_{am}$ is the wire resistance of the aggressor m net 306 from the aggressor driver 308 up to the coupling point to the victim net 302. $R_{am}$ may be calculated as the sum of the wire segment resistances of the aggressor m net 306 retrieved from the SPEF (standard parasitic exchange format) file. Specifically, $R_{am}$ is the sum of all wire resistances from the aggressor driver 308 to the coupling point of the parasitic capacitance $C_{cm}$ to the victim net 302. The wire resistance $R_{am}$ is a function of the nominal aggressor wire resistance $R_{am}'$, temperature, and a temperature coefficient tcoeff:

$$R_{am} = R_{am}'(1+(\text{temperature}-25)*t\text{coeff}) \quad (5)$$

where:
temperature=115 in WC mode, −40 in BC mode, and 25 in NC mode; and
tcoeff is a technology constant obtained by test chip measurements.

The resistance $R_{vm}$ is the effective resistance $R_v$ of the victim driver 304 plus the nominal victim wire resistance $R_{v\_m}$ as shown in the formulas (3) above. The effective resistance $R_v$ may be read from the cell library as the DC driver resistance of the victim driver 304 for the selected operating conditions WC (worst case), BC (best case), and NC (nominal case). The wire resistance $R_{v\_m}$ is a function of the nominal wire resistance $R_{v\_m}'$, temperature, and a temperature coefficient tcoeff:

$$R_{v\_m} = R_{v\_m}'(1+(\text{temperature}-25)*t\text{coeff}) \quad (6)$$

where:
temperature=115 in WC mode, −40 in BC mode, and 25 in NC mode; and
tcoeff is a technology constant obtained by test chip measurements.

The wire resistance $R_{v\_m}$ may be calculated as the sum of the wire segment resistances from the victim driver 304 to the coupling point of the aggressor m net 306 as shown in the formulas (3) above, where the wire segment resistances $R_1, R_2, \ldots$ may be estimated from the SPEF file as discussed below in further detail.

The capacitance $C_{cm}$ is the coupling capacitance between the aggressor net m 306 and the victim net 302. The total net capacitance $C_{vT}$ is given by:

$$C_{vT} = C_v + C_{cm} \quad (7)$$

where $C_v$ is given by the formula (3) above, so that:

$$C_v = (C_{v1} + C_{v2} + \ldots + C_{vn}) + (C_{c1} + C_{c2} + \ldots + C_{cN}) \quad (8)$$

All the capacitances on the right side of the formula (8) may be found in the SPEF file.

The ratio $r_m$ of the coupling capacitance $C_{cm}$ to the total net capacitance $C_{vT}$ may be expressed as:

$$r_m = C_{cm}/C_{vT} \quad (9)$$

The formulas (4) may then be simplified so that the individual noise $VX_m$ coupled from the aggressor net m 306 into the victim net 302 is given by:

$$VX_m = r_m \cdot V_{dd} \cdot \left(\frac{\tau_T}{\tau_m}\right)^{\frac{\tau_m}{\tau_m - \tau_T}} \quad \text{if } \tau_m - \tau_T \neq 0 \quad (10)$$

$$VX_m = r_m \cdot V_{dd} \cdot e^{-1} \quad \text{if } \tau_m - \tau_T = 0$$

In noise analysis, it is important to consider two types of possible noise. If the victim net is at a zero or low voltage state, and if the aggressor nets switch from zero to one, that is, the low-to-high transition, then peak noise is observed at the victim net. If the victim net is at a one or high voltage state, and if the aggressor nets switch from one to zero, that is, the high-to-low transition, then a noise drop is observed at the victim net. The model and formulas given above may be used to find both values of noise coupled into the victim net. For peak noise $VX_p$, the victim driver resistance at low voltage and the aggressor driver resistance for the transition from low-to-high voltage are used. For the noise drop $VX_d$, the victim driver resistance at high voltage and the aggressor driver resistance for the transition from high-to-low voltage are used.

The nominal wire resistance $R_{v\_m}'$ and the nominal aggressor wire resistance $R_{am}'$ may be estimated using the resistance available from the SPEF file as follows. Real net structure is a tree-like structure, and the same is true for a resistance graph of the net as shown in FIG. 1. However, the resistance structure in the SPEF file may not be a tree in the general case as illustrated in FIGS. 5A, 5B and 5C.

FIGS. 5A, 5B, and 5C illustrate examples of net resistance graphs according to an embodiment of the present invention. Shown in FIGS. 5A, 5B and 5C are a victim driver 502, a victim net 504, receivers 506 and 508, aggressor net coupling capacitance $C_{cm}$ 510, a noise coupling node 512, an additional resistance node 514, and wire resistances 516.

FIG. 5A illustrates the victim net 504 with noise coupling from the aggressor net coupling capacitance $C_{cm}$ 510.

FIG. 5B illustrates a resistance graph of the victim net 504 that includes the wire resistances 516 R1, R2, R3, and R4 and the additional resistance node 514.

FIG. 5C illustrates a resistance graph of the victim net 504 obtained from the SPEF file with no resistance nodes.

FIG. 5D illustrates an example of a resistance tree constructed from the resistance net graph of FIG. 5C. In this representation of the resistance net graph, the number of resistances is minimized.

FIG. 5E illustrates an example of a resistance star tree constructed from SPEF coordinates according to an embodiment of the present invention.

The problem of finding the resistance tree from the SPEF resistance graph is a complex one, because it is not known how many additional resistance nodes 514 should be introduced or what is the structure of the resistance tree. Also, it is time consuming to calculate the appropriate wire resistances.

One method of finding a resistance tree from the SPEF resistance graph is to build the minimum resistance tree illustrated in FIG. 5D, in which a resistance path from the victim driver 502 to each resistance node has a minimum resistance. The resistance tree may be found by the well-known technique of equal costs in graph theory, however, a disadvantage of this technique is that the values of some resistances may be overestimated. In the example of FIG. 5C, the actual resistance of the path from the victim driver 502 to the receiver 508 is (R1+(R5+R6)R7/(R5+R6+R7)). The resistance path found from the resistance tree in FIG. 5D is (R1+R7).

Another method of finding a resistance tree from the SPEF resistance graph is to build the star tree illustrated in FIG. 5E using the coordinates of all resistance nodes that may be obtained from the SPEF file, where each wire resistance connects the victim driver 502 to a resistance node and has a value given by:

$$R(\text{driver, node}) = R_{unit}(|X_{driver} - X_{node}| + |Y_{driver} - Y_{node}|) \quad (11)$$

where $R_{unit}$ is the resistance of a unit length of the victim net wire, $(X_{driver}, Y_{driver})$ are the driver coordinates, and $(X_{node}, Y_{node})$ are the node coordinates. This formula may also be used to calculate the resistance of each path from the driver to each node. A disadvantage of this method is that some heuristics should be used to define the value of $R_{unit}$ for each net, because the value of $R_{unit}$ depends on the metal layer in which the net is implemented.

To conserve computation time, a set of screening criteria may be used to identify those nets that are most likely to have a crosstalk violation and should be analyzed because noise may lead to false switching of a state cell, such as flip-flops, latches, and memories. A pin is identified herein to be noise critical if it is a pin of a state cell and if a signal transition on the pin can cause the cell to change state. A net (signal) is identified herein to be noise critical if the net contains a noise critical pin.

There are several methods that may reduce the computation time for noise analysis by filtering out nets that do not require noise analysis because they are not subject to noise interference. On the other hand, other filtering techniques may be used to find nets that should be subjected to noise analysis. For example, the following filters may be used to determine which nets may be excluded from noise analysis:

F1: nets that do not drive noise critical pins or cells that generate noise critical signals;

F2: victim nets having small total capacitance, for example, less than 5 pf.

F3: victim nets having a small coupling ratio: $r = r_1 + r_2 + \ldots + r_m + \ldots + r_N < \text{const}$, where const may be, for example, less than 0.5, and $r_m$ is a coupling ratio to aggressor m as described above with respect to formula (9); and F6: aggressor nets that have a small coupling to the victim net, for example, 0.05.

The following filters may be used to determine which nets should be included in the noise analysis:

F4: nets that drive noise critical pins; and

F5: nets that drive cells that generate noise critical signals.

Noise is not generally propagated through cells, however, a noise level that exceeds a usually high noise threshold value VP(cell) may propagate some propagated noise fraction F(cell) of the noise VX through the cell. A method of accounting for noise propagation through cells in estimating crosstalk noise according to an embodiment of the present invention is described as follows.

Each cell is pre-characterized by determining values for the noise threshold value VP(cell) and the propagated noise fraction F(cell) and storing the values in a cell library according to well-known techniques.

The filter F4 is applied during noise analysis to find the nets NETS(F4) that drive noise critical pins. In some cases, the filter F5 is applied to find the nets NETS(F5,C) that drive a cell C which generates a noise critical signal from the list in NETS(F4). The following rules describe the noise propagation through the cell C driven by a net N in the list NETS(F5,C):

R1: If the net N has a noise level VX that is less than VP(C), then an additional noise VXa(N) equal to zero will be propagated through the cell C from the net N.

R2: If the net N has a noise level VX that is greter than or equal to VP(C), then an additional noise VXa(N) at least equal to VX*F(C) will be propagated through the cell C from the net N.

R3: If the cell C is driven by multiple nets from NETS(F5, C), then an additional noise VXa equal to the maximum value of VXa(N) will be propagated through the cell C from the multiple nets and should be added to the output net driven by the cell C.

Two values of additional propagated noise may be calculated as described above for the peak noise $VXa_p$ and the drop noise $VXa_d$.

Each critical pin is pre-characterized by determining values for peak noise threshold $VT_{p(pin)}$ and drop noise threshold $VT_{d(pin)}$ and storing the values in the cell library according to well-known techniques. The following criteria may be used to determine whether a net failure will occur in the integrated circuit design:

If the noise in a net N is greater than or equal to the noise threshold for a critical pin P:

$$\text{Failure criterion (1): } VX_{p(N)} \geq VT_{p(P)} \text{ or} \quad (11)$$

$$\text{Failure criterion (2): } VX_{d(N)} \geq VT_{d(P)}$$

If a critical net N has several critical pins, then the following criteria may be used to determine whether a net failure will occur in the integrated circuit design:

$$\text{Failure criterion (1): } VX_{p(N)} \geq VT_{p(N)} \text{ or} \quad (12)$$

$$\text{Failure criterion (2): } VX_{d(N)} \geq VT_{d(N)}$$

where $VT_{p(N)}$ and $VT_{d(N)}$ are noise thresholds for the net N:

$$VT_{p(N)} = \min_N \{VT_{p(P)}\} \text{ for all critical pins P in the net} \quad (13)$$

$$VT_{d(N)} = \min_N \{VT_{d(P)}\} \text{ for all critical pins P in the net}$$

FIG. 6 illustrates a flow chart 600 of a method of analyzing crosstalk noise according to an embodiment of the present invention.

Step 602 is the entry point of the flow chart 600.

In step 604, an SPEF file for an integrated circuit floorplan design is received as input.

In step 606, the SPEF file is parsed to generate a resistance graph. The resistance graph contains all the information from the SPEF file to facilitate future processing and access. For example, the resistance graph may be a data structure that provides the cell type for each cell instance, the driver for each net in the integrated circuit design, and so on.

In step 608, a representation of the resistance graph is constructed from the resistance graph. The representation of the resistance graph may be, for example, a resistance tree or a resistance star tree as described above with reference to FIGS. 5D and 5E.

In step 610, the nets in the representation of the resistance graph are filtered using the filters F2 and F3 described above to exclude nets that are not subject to false switching from crosstalk noise.

In step 612, the nets in the representation of the resistance graph are filtered using the filter F4 described above to include nets that drive logical stages that drive noise critical nets.

In step 614, a list of the nets that were not excluded in step 610 and the nets that were included in step 612 are generated as output in a list of nets NETS(F4). The list of nets NETS(F4) includes only noise critical nets that may be subject to false switching from crosstalk noise and nets that drive logical stages that drive noise critical nets.

In step 616, a net from the list NETS(F4) is selected.

In step 618, a noise VX from all aggressor nets relative to the selected net in the representation of the resistance graph is calculated as described in further detail below from the pre-characterized information stored in the cell library as described above.

In step 620, after calculating the noise propagated into the selected net from all aggressor nets, an additional check is performed to consider the maximum possible noise that may be propagated into the selected net from the previous logical stage.

In step 622, noise violations are reported so that they may be corrected by modifying the floorplan of the integrated circuit design as described in further detail below. For example, the report may include the name of the victim net in which the noise violation occurred along with the noise peak/drop and the names of the victim net's top ten aggressors.

In step 624, if all nets in the list NETS(F4) have been selected, then control is transferred to step 626. Otherwise, control is transferred to step 616.

Step 626 is the exit point of the flow chart 600.

FIG. 7 illustrates a flow chart 700 for calculating noise in the selected net in the method of FIG. 6.

Step 702 is the entry point of the flow chart 700.

In step 704, a graph model of the selected net is constructed as described above with respect to FIGS. 5B and 5C. The graph model may contain resistive loops, as illustrated in FIG. 5C.

In step 706, a tree model is constructed from the graph model as described above with respect to FIGS. 5D and 5E.

In step 708, the values for the peak noise $VX_{p(N)}$ and the drop noise $VX_{d(N)}$ from all aggressors relative to the selected net are calculated as described above with respect to the formulas (10). The values of the aggressor noise are then compared in steps 710 and 712 to determine whether propagated noise contributes to the noise in the selected net.

In step 710, if the peak noise $VX_{p(N)}$ is less than the peak noise threshold minus the peak propagation noise threshold $(VT_{p(N)}-VP_p)$, then control is transferred to step 712. Otherwise, control is transferred to step 714.

In step 712, if the drop noise $VX_{d(N)}$ is greater than or equal to the drop noise threshold minus the drop propagation noise threshold $(VT_{d(N)}-VP_d)$, then control is transferred to step 714. Otherwise, control is transferred to step 718.

In step 714, the values of the peak propagated noise $VXa_p$ and the drop propagated noise $VXa_d$ are calculated using the rules R1, R2, R3 and the filter F5 as described above for the selected net.

In step 716, the values calculated for the propagated noise are added to the values calculated for the peak noise $VX_{p(N)}$ and the drop noise $VX_{d(N)}$ in step 708.

Step 718 is the exit point of the flow chart 700.

FIG. 8 illustrates a flow chart for performing an additional check to consider noise propagated into the selected net from the previous logical stage in the method of FIG. 6.

Step 802 is the entry point of the flow chart 800.

In step 804, the calculated peak noise $VX_{p(N)}$ is compared to the pre-characterized peak noise threshold $VT_{p(N)}$ stored in the cell library. If $VX_{p(N)}$ is less than $VT_{p(N)}$, then control is transferred to step 806. Otherwise, control is transferred to step 808.

In step 806, the calculated drop noise $VX_{d(N)}$ is compared to the pre-characterized drop noise threshold $VT_{d(N)}$ stored in the cell library. If $VX_{d(N)}$ is less than $VT_{d(N)}$, then control is transferred to step 810. Otherwise, control is transferred to step 808.

In step 808, a noise report is constructed for the selected net including the name of the selected victim net, the peak noise $VX_{p(N)}$, the drop noise $VX_{d(N)}$, the names of the ten most significant aggressor nets and their respective contribution to the noise propagated into the selected victim net.

Step 810 is the exit point of the flow chart 800.

The noise violations in the integrated circuit design found may be corrected using the calculations described above to perform appropriate modifications to the floorplan of the integrated circuit design. Specifically, the driver power of a victim net may be increased, the driver power of an aggressor net may be decreased, a buffer may be inserted in the victim net to reduce net delay, and a buffer may be inserted in the aggressor net to reduce net delay as described in further detail below. If the crosstalk still exceeds the crosstalk peak or drop noise thresholds of the victim net, the victim net and its aggressors may be re-routed according to well-known techniques. Advantageously, the correction of a noise violation in accordance with the method of the present invention may be performed in a single pass, in contrast to previous methods of correcting noise violations that typically require multiple lengthy calculations.

FIGS. 9A, 9B and 9C illustrate a flow chart 900 for correcting a noise violation according to an embodiment of the present invention.

Step 902 is the entry point of the flow chart 900.

In step 904, a victim net for which a noise violation is reported as described above is selected.

In step 906, if the selected victim net is also an aggressor net to another noise critical net, then control is transferred to step 912. Otherwise, control is transferred to step 908.

In step 908, the driver of the selected victim net is "up-sized", that is, replaced with a driver having higher drive power, and the crosstalk into the victim net is recalculated for the new victim driver.

In step 910, if the selected victim net still has a noise violation, then control is transferred to step 912. Otherwise, control is transferred to step 944.

In step 912, if the selected victim net is timing critical, then control is transferred to step 918. Otherwise control is transferred to step 914. The selected victim net is timing critical if it belongs to a timing critical path. A path is timing critical if its delay is close to the clock period, for example, within ten percent.

In step 914, a buffer is inserted in the selected victim net to reduce net delay according to well-known techniques, and the crosstalk into the selected victim net is recalculated with the new buffer.

In step 916, if the selected victim net still has a noise violation, then control is transferred to step 918. Otherwise, control is transferred to step 944.

In step 918, the most significant aggressor net relative to the victim net is selected, that is, the aggressor net coupling the greatest amount of crosstalk noise into the selected victim net that has not been previously selected.

In step 920, if the selected aggressor net is timing critical, then control is transferred to step 930. Otherwise, control is transferred to step 922.

In step 922, if the selected aggressor net is noise critical, then control is transferred to step 924. Otherwise, control is transferred to step 926.

In step 924, if the selected aggressor net has a noise violation, then control is transferred to step 930. Otherwise, control is transferred to step 926.

In step 926, the driver of the selected aggressor net is "down-sized", that is, replaced with a driver having a lower drive power, preferably the lowest possible drive power, and the crosstalk into the selected victim net is recalculated with the new driver.

In step 928, if the selected victim net has a noise violation, then control is transferred to step 930. Otherwise, control is transferred to step 944.

In step 930, if a buffer may be inserted in the selected aggressor net to reduce net delay, then control is transferred to step 932. Otherwise, control is transferred to step 936.

In step 932, a buffer is inserted in the selected aggressor net, and the crosstalk into the selected victim net is recalculated with the new buffer.

In step 934, if the selected victim net has a noise violation, then control is transferred to step 936. Otherwise, control is transferred to step 944.

In step 936, if there is another aggressor net relative to the victim net that has not been selected, then control is transferred back to step 918. Otherwise, control is transferred to step 938.

In step 938, the routing of the selected victim net and its aggressors is modified to minimize crosstalk coupling into the victim net according to well-known techniques.

In step 940, if the noise violation(s) were successfully corrected by the modifications in step 938, then control is transferred to 944. Otherwise, control is passed to step 942.

In step 942, a noise violation is reported in the selected victim net, and control is transferred to step 944.

Step 944 is the exit point of the flow chart 900.

As may be appreciated from the method of noise analysis and correction of noise violations according to the present invention described above, the effect of crosstalk noise on the performance of an integrated circuit design may be estimated more quickly and more simply compared to previous methods. Advantageously, the only input required is the SPEF file that is already available from the design flow. The SPEF file includes all the values of the capacitances, coupling capacitances, resistances, cell types, and cell coordinates. The models developed according to the method of the present invention produce results comparable to SPICE modeling at a much lower cost and turnaround time.

Unique features of the noise analysis and correction of noise violations according to the method of the present invention include selecting only noise critical nets and nets that propagate noise into noise critical nets for noise analysis, incorporating different noise threshold values for different cells and pins, the calculation of both peak and drop noise for each selected noise critical net, and the modification of the floorplan to correct possible noise violations.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow charts described above may also be implemented by instructions performed on a computer according to well-known computer programming techniques.

In another aspect of the present invention, a computer program product for analyzing noise for an integrated circuit design includes:

a medium for embodying a computer program for input to a computer; and a computer program embodied in the medium for causing the computer to perform steps of:

(a) receiving as input a standard parasitic exchange file for an integrated circuit design;

(b) parsing the standard parasitic exchange file to generate a resistance graph;

(c) generating a representation of the resistance graph to determine noise critical nets;

(d) generating a list of only noise critical nets from the representation of the resistance graph;

(e) selecting a net from the list of only noise critical nets;

(f) calculating a value of total crosstalk noise in the selected net from all aggressor nets relative to the selected net; and (g) generating as output the value of total crosstalk noise in the selected net for correcting a possible noise violation.

While the invention herein disclosed has been described by means of specific embodiments and applications thereof, numerous modifications and variations could be made thereto by those skilled in the art without departing from the scope of the invention set forth in the following claims.

What is claimed is:

1. A method of noise analysis and correction of noise violations for an integrated circuit design comprising steps of:

(a) receiving as input a standard parasitic exchange file for an integrated circuit design;

(b) parsing the standard parasitic exchange file to generate a resistance graph;

(c) generating a representation of the resistance graph to determine noise critical nets;

(d) generating a list of only noise critical nets from the representation of the resistance graph;

(e) selecting a victim net from the list of only noise critical nets;

(f) calculating a value of total crosstalk noise in the selected victim net from all aggressor nets relative to the selected victim net; and (g) generating as output the value of total crosstalk noise in the selected victim net for correcting a noise violation.

2. The method of claim 1 wherein step (c) comprises generating one of a resistance tree and a resistance star tree as the representation of the resistance graph.

3. The method of claim 1 wherein step (d) comprises filtering the nets in the representation of the resistance graph to exclude nets that are not subject to false switching from crosstalk noise.

4. The method of claim 1 wherein step (d) comprises filtering the nets in the representation of the resistance graph to include nets that drive logical stages that drive noise critical nets.

5. The method of claim 1 wherein step (f) comprises calculating a peak noise and a drop noise for the selected net.

6. The method of claim 5 wherein step (f) comprises comparing the peak noise and the drop noise to a peak noise threshold and a drop noise threshold for the selected victim net to determine whether a noise violation may occur in the selected net.

7. The method of claim 6 wherein step (g) comprises generating a report of a noise violation if the peak noise threshold or the drop noise threshold is exceeded.

8. The method of claim 7 wherein step (g) comprises reporting a name of the selected victim net, the peak noise, the drop noise, and names of significant aggressor nets and their respective contributions to the total noise.

9. The method of claim 1 wherein step (f) comprises calculating a crosstalk noise $VX_m$ coupled into the selected victim net by an aggressor by the following formulas:

$$VX_m = V_{dd} \frac{\tau_{cm}}{\tau_T} \cdot \left(\frac{\tau_T}{\tau_m}\right)^{\frac{\tau_m}{\tau_m - \tau_T}} \quad \text{if } \tau_m - \tau_T \neq 0 \text{ and}$$

$$VX_m = V_{dd} \frac{\tau_{cm}}{\tau_T} \cdot e^{-1} \quad \text{if } \tau_m - \tau_T = 0.$$

10. The method of claim 9 wherein step (f) comprises calculating a ratio $r_m$ of a coupling capacitance $C_{cm}$ to a total net capacitance $C_{vT}$ so that the crosstalk noise $VX_m$ is given by:

$$VX_m = r_m \cdot V_{dd} \cdot \left(\frac{\tau_T}{\tau_m}\right)^{\frac{\tau_m}{\tau_m - \tau_T}} \quad \text{if } \tau_m - \tau_T \neq 0 \text{ and}$$

$$VX_m = r_m \cdot V_{dd} \cdot e^{-1} \quad \text{if } \tau_m - \tau_T = 0.$$

11. The method of claim 1 further comprising a step of selecting an equivalent transient resistance of an aggressor net as an aggressor driver resistance for worst case, best case, and nominal case operating condition from a cell library.

12. The method of claim 1 further comprising a step of determining values of a peak noise threshold and a drop noise threshold for the selected net and storing the values in a cell library.

13. The method of claim 1 wherein step (g) further comprises correcting a noise violation in the integrated circuit design by modifying a floorplan of the integrated circuit design wherein modifying the floorplan comprises at least one of increasing driver power of the selected victim net, decreasing driver power of an aggressor net, inserting a buffer in the victim net to reduce net delay, inserting a buffer in at least one of the aggressor nets to reduce net delay, and re-routing the victim net and its aggressors.

14. A computer program product for analyzing noise and correcting noise violations for an integrated circuit design comprising:
   a medium for embodying a computer program for input to a computer; and
   a computer program embodied in the medium for causing the computer to perform steps of:
   (a) receiving as input a standard parasitic exchange file for an integrated circuit design;
   (b) parsing the standard parasitic exchange file to generate a resistance graph;
   (c) generating a representation of the resistance graph to determine noise critical nets;
   (d) generating a list of only noise critical nets from the representation of the resistance graph;
   (e) selecting a net from the list of only noise critical nets;
   (f) calculating a value of total crosstalk noise in the selected net from all aggressor nets relative to the selected net; and
   (g) generating as output the value of total crosstalk noise in the selected net for correcting a noise violation.

15. The computer program product of claim 14 wherein step (c) comprises generating one of a resistance tree and a resistance star tree as the representation of the resistance graph.

16. The computer program product of claim 14 wherein step (d) comprises filtering the nets in the representation of the resistance graph to exclude nets that are not subject to false switching from crosstalk noise.

17. The computer program product of claim 14 wherein step (d) comprises filtering the nets in the representation of the resistance graph to include nets that drive logical stages that drive noise critical nets.

18. The computer program product of claim 14 wherein step (f) comprises calculating a peak noise and a drop noise for the selected net.

19. The computer program product of claim 18 wherein step (f) comprises comparing the peak noise and the drop noise to a peak noise threshold and a drop noise threshold for the selected net to determine whether a noise violation may occur in the selected net.

20. The computer program product of claim 19 wherein step (g) comprises generating a report of a noise violation if the peak noise threshold or the drop noise threshold is exceeded.

21. The computer program product of claim 20 wherein step (g) comprises reporting a name of the selected net, the peak noise, the drop noise, and names of significant aggressor nets and their respective contributions to the total noise.

22. The computer program product of claim 14 wherein step (f) comprises calculating a crosstalk noise $VX_m$ coupled into the selected net by an aggressor by the following formulas:

$$VX_m = V_{dd} \frac{\tau_{cm}}{\tau_T} \cdot \left(\frac{\tau_T}{\tau_m}\right)^{\frac{\tau_m}{\tau_m - \tau_T}} \quad \text{if } \tau_m - \tau_T \neq 0 \text{ and}$$

$$VX_m = V_{dd} \frac{\tau_{cm}}{\tau_T} \cdot e^{-1} \quad \text{if } \tau_m - \tau_T = 0.$$

23. The computer program product of claim 22 wherein step (f) comprises calculating a ratio $r_m$ of a coupling capacitance $C_{cm}$ to a total net capacitance $C_{vT}$ so that the crosstalk noise $VX_m$ is given by:

$$VX_m = r_m \cdot V_{dd} \cdot \left(\frac{\tau_T}{\tau_m}\right)^{\frac{\tau_m}{\tau_m - \tau_T}} \quad \text{if } \tau_m - \tau_T \neq 0 \text{ and}$$

$$VX_m = r_m \cdot V_{dd} \cdot e^{-1} \quad \text{if } \tau_m - \tau_T = 0.$$

24. The computer program product of claim 14 further comprising a step of selecting an equivalent transient resistance of an aggressor net as an aggressor driver resistance for worst case, best case, and nominal case operating conditions from a cell library.

25. The computer program product of claim 14 further comprising a step of determining values of a peak noise threshold and a drop noise threshold for the selected net and storing the values in a cell library.

26. The computer program product of claim 14 wherein step (g) further comprises correcting a noise violation in the integrated circuit design by modifying a floorplan of the integrated circuit design wherein modifying the floorplan comprises at least one of:
   increasing driver power of the selected victim net;
   decreasing driver power of an aggressor net;

inserting a buffer in the victim net to reduce net delay;
inserting a buffer in at least one of the aggressor nets to reduce net delay; and
re-routing the victim net and its aggressors.

27. A method of noise analysis and correction of noise violations for an integrated circuit design comprising steps of:
(a) receiving as input a standard parasitic exchange file for an integrated circuit design;
(b) parsing the standard parasitic exchange file to generate a resistance graph;
(c) generating a list of only noise critical nets from the representation of the net resistance graph;
(d) calculating a value of total crosstalk noise in a selected victim net in the list of noise critical nets from all aggressor nets relative to the selected victim net; and
(e) generating as output the value of total crosstalk noise in the selected victim net for correcting a noise violation.

* * * * *